United States Patent
Schultz et al.

(10) Patent No.: US 10,622,447 B2
(45) Date of Patent: Apr. 14, 2020

(54) GROUP III-NITRIDE STRUCTURE HAVING SUCCESSIVELY REDUCED CRYSTALLOGRAPHIC DISLOCATION DENSITY REGIONS

(71) Applicant: Raytheon Company, Waltham, MA (US)

(72) Inventors: Brian D. Schultz, Lexington, MA (US); Theodore D. Kennedy, Derry, NH (US); Amanda Kerr, Chelmsford, MA (US); William E. Hoke, Wayland, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/472,708

(22) Filed: Mar. 29, 2017

(65) Prior Publication Data

US 2018/0286954 A1    Oct. 4, 2018

(51) Int. Cl.
*C30B 25/02* (2006.01)
*H01L 29/20* (2006.01)
*H01L 21/02* (2006.01)

(52) U.S. Cl.
CPC ...... *H01L 29/2003* (2013.01); *H01L 21/0254* (2013.01); *H01L 21/0259* (2013.01);
(Continued)

(58) Field of Classification Search
CPC ......... C30B 29/38; C30B 25/02; C30B 25/14; C30B 23/02
See application file for complete search history.

(56) References Cited

U.S. PATENT DOCUMENTS

| 5,385,862 A | 1/1995 | Moustakas |
| 6,075,701 A | 6/2000 | Ali et al. |

(Continued)

FOREIGN PATENT DOCUMENTS

| TW | 20125115 A | 12/2012 |
| TW | 201344804 A | 11/2013 |

(Continued)

OTHER PUBLICATIONS

Aidam et al., "Reproducible and Uniform Growth of GaN based HEMTs on 4 Inch SiC by Plasma Assisted Molecular Beam Epitaxy Suitable for Production;" Physica Status Solidi A, Applications and Materials Science, vol. 207, No. 6; Mar. 12, 2010; 5 pages.

(Continued)

*Primary Examiner* — Robert M Kunemund
(74) *Attorney, Agent, or Firm* — Daly, Crowley, Mofford & Durkee, LLP

(57) ABSTRACT

A structure having: a nucleation layer; and a Group III-Nitride structure disposed on a surface of the nucleation layer, the Group III-Nitride structure comprising a plurality of pairs of stacked Group III-Nitride layers, each one of the pairs of layers having a lower layer having a 3D growth structure and each one of the upper one of the pairs of layers having a 2D growth structure. Each one of the lower layers at completion has a surface roughness greater than a surface roughness at completion of an upper one of the pair of layers. Interfaces between each one of the upper layers and each one of the lower layers of the plurality of pairs of stacked Group III-Nitride layers have crystallographic dislocation combinations and/or annihilations therein.

24 Claims, 10 Drawing Sheets

(52) U.S. Cl.
CPC .. *H01L 21/02378* (2013.01); *H01L 21/02458* (2013.01); *H01L 21/02507* (2013.01); *H01L 21/02645* (2013.01)

(56) References Cited

U.S. PATENT DOCUMENTS

| | | | |
|---|---|---|---|
| 7,776,152 | B2 | 8/2010 | Hoke et al. |
| 2002/0069817 | A1 | 6/2002 | Mishra et al. |
| 2003/0235934 | A1 | 12/2003 | Manfra et al. |
| 2007/0141823 | A1 | 6/2007 | Preble et al. |
| 2010/0177796 | A1 | 7/2010 | Miller |
| 2015/0279675 | A1* | 10/2015 | Hanser .............. C30B 25/02 438/478 |
| 2015/0295132 | A1* | 10/2015 | Jang .............. H01L 21/0237 257/76 |
| 2017/0042058 | A1 | 2/2017 | Pope et al. |

FOREIGN PATENT DOCUMENTS

| | | |
|---|---|---|
| TW | 201535516 A | 9/2015 |
| TW | 201540861 A | 11/2015 |

OTHER PUBLICATIONS

Corrion et al., Review of recent Developments in Growth of AlGaN/GaN High-Electron Mobility Transistors on 4H—SiC by Plasma-Assisted Molecular Beam Epitaxy; The Institute of Electronics, Information and Communication Engineers, vol. E89-C, No. 7; Jul. 2006; 8 pages.

Heying et al., Control of GaN Surface Morphologies Using Plasma-Assisted Molecular Beam Epitaxy; American Institute of Physics, Journal of Applied Physics, vol. 88, No. 4; Aug. 15, 2000; 6 pages.

Inoki et al., "Growth of GaN on Porous SiC Substrates by Plasma-Assisted Molecular Beam Epitaxy;" Materials Research Society Symposium Proceedings, vol. 722; 2002; 6 pages.

Kaun et al., "Correlation Between Threading Dislocation Density and Sheet Resistance of AlGaN/AlN/GaN Heterostructures Grown by Plasma-Assisted Molecular Beam;" American Institute of Physics, Applied Physics Letters, vol. 100; Jun. 25, 2012; 4 pages.

Kaun et al., "Molecular Beam Epitaxy for High-Performance Ga-face GaN Electron Devices;" IOP Publishing; Jun. 21, 2013; 15 pages.

Koblmuller et al., Dislocation Reduction in AlGaN/GaN Heterostructures on 4H—SiC by Molecular Beam Epitaxy in the Thermal Decomposition Regime; The Japan Society of Applied Physics, Applied Physics Express; Jun. 6, 2008; 3 pages.

Koblmuller et al., "In Situ Investigation of Growth Modes During Plasma-Assisted Molecular Beam Epitaxy of (0001) GaN;" American Institute of Physics, Applied Physics Letters, vol. 91; Oct. 15, 2007; 3 pages.

Lee et al., "Role of Ga Flux in Dislocation Reduction in GaN Films Grown on SiC (0001);" American Institute of Physics, Applied Physics Letters, vol. 79, No. 21; Nov. 19, 2001; 3 pages.

Liu et al., "High Quality GaN Epitaxial Layers Grown by Modulated Beam Growth Method;" Materials Chemistry and Physics; Feb. 25, 2004; 4 pages.

Liu et al., "Modulated Beam Growth Method for MBE Grown GaN Layers;" Journal of Crystal Growth; Nov. 28, 2003; 6 pages.

Manfra et al., "Dislocation and Morphology Control During Molecular-Beam Epitaxy of AlGaN/GaN Heterostructures Directly on Sapphire Substrates;" American Institute of Physics, Applied Physics Letters, vol. 81, No. 8; Aug. 19, 2002; 3 pages.

McSkimming et al., "High Active Nitrogen Flux Growth of GaN by Plasma Assisted Molecular Beam Epitaxy;" American Vacuum Society; Sep./Oct. 2015; 9 pages.

Poblenz et al., Uniformity and Control of Surface Morphology During Growth of GaN by Molecular Beam Epitaxy; American Vacuum Society; Jul./Aug. 2005; 7 pages.

Schultz, "16-8394 Group III-Nitride Structure with Periodic Dislocation Bending;" Raytheon Proprietary; Jan. 1, 2015; 5 pages.

Springer, "Springer Series in Materials Science, Gallium Nitride Electronics;" Springer-Verlag, Berlin Heidelberg; 2008; 492 pages.

Tarsa et al., "Homoepitaxial Growth of GaN Under Ga-stable and N-stable Conditions by Plasma-Assisted Molecular Beam Epitaxy;" American Institute of Physics; Dec. 1, 1997; 8 pages.

Waltereit et al., "Structural Properties of GaN Buffer Layers on 4H—SiC(0001) Grown by Plasma-Assisted Molecular Beam Epitaxy for High Electron Mobility Transistors;" Japanese Journal of Applied Physics, vol. 43, No. 12A; Nov. 5, 2004; 4 pages.

Wong et al., "The Roles of Threading Dislocations on Electrical Properties of AlGaN/GaN Heterostructure Grown by MBE;" Journal of the Electrochemical Society, 157; May 17, 2010; 4 pages.

Office Action dated Oct. 31, 2018 for Taiwan Patent Application No. 107110711 with English Translation; 6 Pages.

PCT Notification of Transmittal of the International Search Report and Written Opinion of the ISA dated Jul. 25, 2018 for PCT/US2018/024303; 1 Page.

PCT International Search Report dated Jul. 25, 2018 for PCT/US2018/024303; 5 Page.

PCT Written Opinion of the ISA dated Jul. 25, 2018 for PCT/US2018/024303; 7 Page.

PCT Invitation to Pay Additional Fees and Partial Search Report dated Oct. 18, 2019 for International Application No. PCT/US2019/016282; 16 Pages.

* cited by examiner

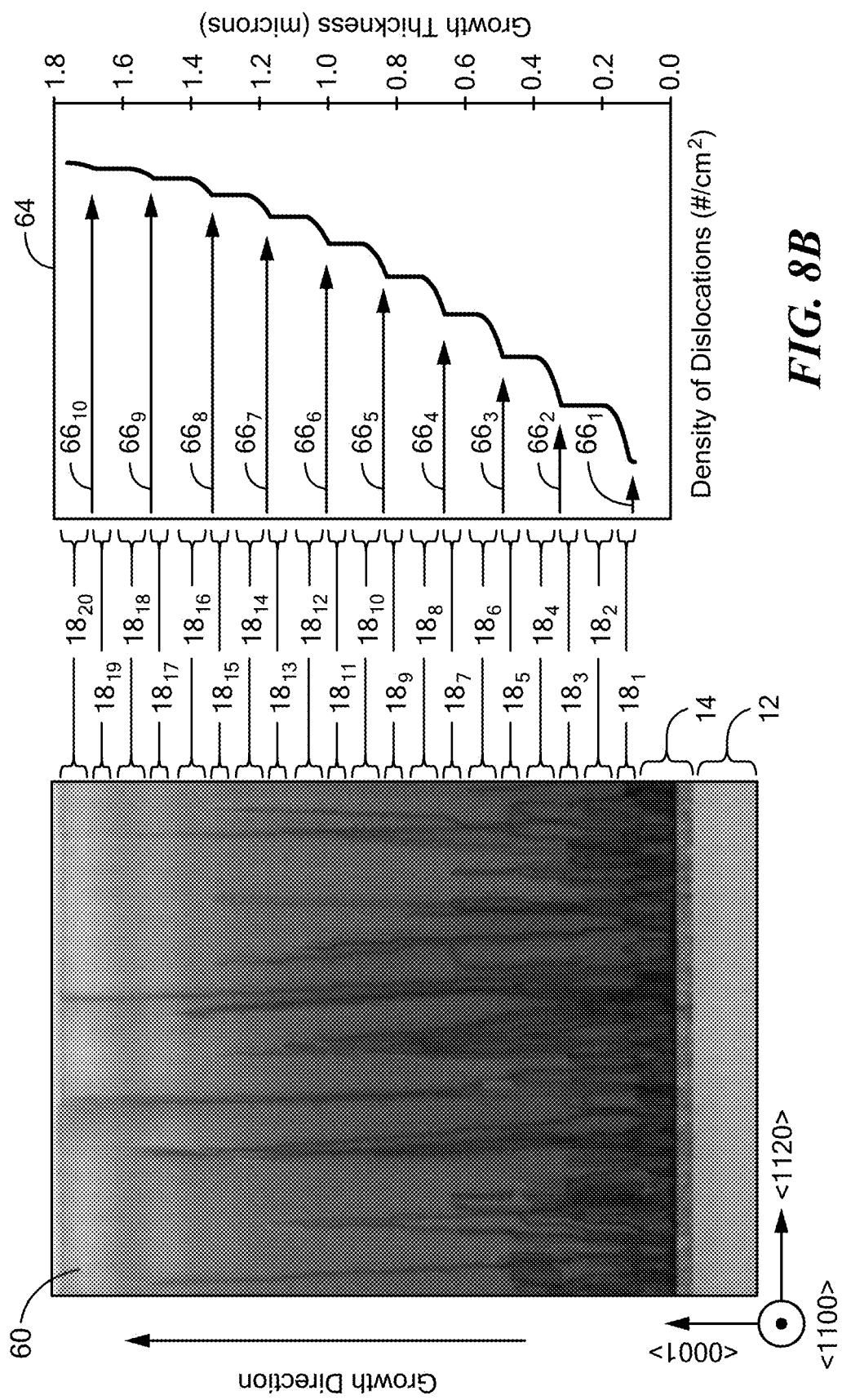

GROUP III-NITRIDE STRUCTURE HAVING SUCCESSIVELY REDUCED CRYSTALLOGRAPHIC DISLOCATION DENSITY REGIONS

TECHNICAL FIELD

This disclosure relates generally to Group III-Nitride structures and more particularly to Group III-Nitride structures having reduced crystallographic dislocations in epitaxial layers of such structures.

BACKGROUND

As is known in the art, Indium Nitride (InN), Gallium Nitride (GaN), Aluminum Nitride (AlN), Boron Nitride (BN) and all of their associated alloys including $In_x(Al_yGa_{1-y})_{1-x}N$ (where $0 \leq x \leq 1$ and $0 \leq y \leq 1$) and $B_z(In_x(Al_yGa_{1-y})_{1-x})_{1-z}N$ (where $0 \leq x \leq 1$ and $0 \leq y \leq 1$ and $0 \leq z \leq 1$) are a family of materials known as Group III-Nitrides. The Group III-Nitrides are used in power and microwave transistor device electronics in part because of their breakdown voltages, bandgap energies, and saturation velocities. One of the principal issues related to device performance is the crystal quality of the epitaxial material grown from Group III-Nitride materials as most epitaxial Group III-Nitride heterostructures are grown on lattice mismatched substrates due to the high cost and low availability of large diameter bulk Group III-Nitride substrates. The lattice mismatch results in the formation of numerous crystallographic dislocations detrimental to device performance. Typically Group III-Nitride buffer layers are grown in excess of one micron in thickness before the active device regions are grown to allow the material to relax and to reduce as many dislocations as possible through the growth process while creating a flat surface morphology.

As is also known in the art, during the growth of GaN by plasma assisted molecular beam epitaxy (PAMBE), gallium atoms are evaporated onto a substrate surface in the presence of an activated nitrogen flux provided by a plasma source. The surface morphology of GaN during growth depends on the substrate temperature and the ratio of the gallium flux to the plasma activated nitrogen flux and has been commonly separated into three principal regimes; an N-stable; an intermediate; and a Ga-droplet growth regime. The N-stable growth regime occurs when the net gallium flux (incident gallium flux minus the rate of desorption from the surface) is less than the flux of activated nitrogen supplied to the surface from the plasma source. The Ga-droplet growth regime occurs when the net gallium flux exceeds the activated nitrogen flux and leads to the accumulation of a gallium wetting layer greater than 2.5 monolayers in thickness and to the formation of gallium droplets on the growth surface. The intermediate growth regime occurs when the net gallium flux exceeds the activated nitrogen flux, but the desorption rate of the gallium is sufficiently high to prevent gallium droplets from accumulating on the growth surface. The intermediate growth regime covers all growth between the N-stable and the Ga-droplet regime and includes various coverages and thicknesses of the gallium wetting layer up to 2.5 monolayers in thickness.

The N-stable and the intermediate growth regimes are also classified as three dimensional (3D) growth regimes as both produce pitted surface with a rough surface morphology. The N-stable GaN growth regime typically produces a rough faceted and heavily pitted surface morphology with a tilted columnar structure and a high density of stacking faults. The surface morphology in the intermediate GaN growth regime varies significantly depending on the amount of gallium accumulation on the growing surface with a continuous reduction in surface pit density and growth planarization as the amount of gallium increases. There is also a transition from layer-by-layer growth to step flow growth within the intermediate growth regime as the gallium flux increases and stabilizes the presence of a 1 to 2.5 monolayer thick gallium adlayer on the surface.

The Ga-droplet GaN growth regime produces atomically flat surfaces and is also classified as a two dimensional (2D) growth regime. If the accumulation of gallium on the surface is allowed to continuously increase during the growth process, the liquid gallium eventually will begin to randomly degrade the quality of the GaN surface. Growth at the crossover boundary, between the Ga-droplet and intermediate growth regimes, has been reported to result in atomically flat surfaces dominated by step flow growth. However, temperature fluctuations of less than a few degrees across a wafer can cause the growth to deviate from the crossover boundary and lead to significant morphological variations across the wafer. To mitigate this problem a number of "modulated" growth methods were developed having short periods of GaN growth in the Ga-droplet GaN growth regime followed by short periods where excess gallium is removed from the surface. In one example of a modulate MBE growth method, the gallium and nitrogen shutters are opened simultaneously for a period of time with the gallium flux high enough for growth to occur in the Ga-droplet regime and then both shutters are simultaneously closed for a period time to allow excess gallium to desorb from the growth surface. In this example, the substrate temperature must be hot enough to desorb the excess gallium from the surface. In another example of a modulated MBE growth method, multiple gallium sources are used for growth with the shutter to one source continuously open and the shutter to the second source alternating between opened and closed. When the second shutter is open, growth occurs in a Ga-droplet regime and excess gallium accumulates on the surface. When the second shutter is closed, the excess gallium begins to be consumed by the growth process and the shutter is kept closed until the excess gallium is cleared from the growth surface. When the excess gallium is cleared, the second shutter is reopened to resume growth in the Ga-droplet regime. A modulation period commonly occurs over a couple hundred Angstroms of growth.

More particularly, during the hetero-epitaxial growth of GaN on a lattice mismatched crystalline substrate, a high density of crystallographic dislocations are produced near the interface of the growing epitaxial GaN film to reduce the strain resulting from the epitaxial misfit. High crystallographic dislocation densities in GaN-based high electron mobility transistors (HEMTs) are undesirable as they lower the electron mobility and raise the sheet resistivity within the two-dimensional electron gas (2 DEG) of the device. Although the modulation growth methods for GaN produce smooth surface morphologies throughout the growth, they also enable the crystallographic dislocations in the GaN to propagate parallel to the growth direction, which keeps dislocation interactions low and dislocation densities high.

According to a paper by C. D. Lee et al., "Role of Ga flux in dislocation reduction in GaN films grown on SiC (0001)", Appl. Phys. Lett. 79, 3428 (2001), the probability of crystallographic dislocation annihilation (A) and/or combination, where a pair of dislocations in the GaN film combine (C) or become annihilated (A), is greatly enhanced when dislocations are clustered rather than randomly spaced since the interactive force is, in general, inversely proportional to the distance between dislocations. When GaN is grown under more nitrogen rich conditions, the surface roughens as the mobility of adatoms on the surface is reduced. The crystallographic dislocations in these films are generally observed to reside in topological valleys along the GaN surface and at the lowest points of the growth surface. It has been theorized by Lee that the rough surface leads to clustering of dislocations in the topological valleys and that the clustering of dislocations leads to a higher rate of dislocation annihilation or combination in the GaN film.

It was later shown by Waltereit et al., "Structural Properties of GaN Buffer Layers on 4H—SiC(0001) Grown by Plasma-Assisted Molecular Beam Epitaxy for High Electron Mobility Transistors", Jap. J. Appl. Phys., 43, L1520 (2004) that the advantage of crystallographic dislocation reduction due to the roughening of the growth surface is limited to the first 100 nm of GaN growth. Eventually all of the crystallographic dislocations (referred to in the paper as threading dislocations) become located at topological valleys and additional growth under the same growth conditions can only create additional clusters by creating significantly larger topological valleys such that two or more smaller valleys merged into a larger valley. Consequently, growth of thicker buffers in this intermediate growth regime only adds to the roughness of the surface without significantly reducing the crystallographic dislocation density. The requirement to drastically increase surface roughness to further reduce crystallographic dislocations is not compatible with device fabrication.

Some GaN layers in the prior art have been reported to be grown in two growth steps as first demonstrated by Manfra et al., in a paper entitled "Dislocation and morphology control during molecular-beam epitaxy of AlGaN/GaN hetero-structures directly on sapphire substrates", Appl. Phys. Lett., 81, 1456 (2002). During the first step the GaN is grown under intermediate, or 3D, growth regime conditions that promote a rough surface morphology to reduce crystallographic dislocations. Manfra et al. point out that, in referring to FIG. 1 of the paper, "The 3D growth mode appears to increase dislocation interactions, and thus, reduces the number of dislocations which propagate to the surface". Manfra et al. also point out that FIG. 1 shows that significant bending of threading dislocations (bending away from the growth direction and move laterally to some degree) is observed throughout the first 750-1000 nm of growth and that many of these dislocations intersect other dislocations "where they can annihilate if the dislocations have Burgers vectors with opposite sign. The arrows in FIG. 1 indicate a few of the closed dislocation loops seen in this film". Manfra et al. point out that "While growth under nitrogen stable conditions appears to enhance threading dislocation interactions, the roughened surface morphology produced by continued growth under these conditions is not optimal for device structures". Thus, in order to produce a surface smooth enough for device fabrication, a "second phase of growth of the insulating GaN buffer, the Ga flux is increased to produce metal stable growth" and "The remainder of the epilayer is grown under these Ga-stable conditions. The Ga flux is limited such that no metal droplets are observed on the surface". Manfra et al. note that "a fairly abrupt change is observed in the defect structure seen in FIG. 1" and that "From this point, many dislocation loops have closed and the remaining threading defects are seen to propagate straight up to the film surface. The rough/smooth transition appears to minimize dislocation bending".

For example, referring to FIG. 1A, a structure is shown having a silicon carbide (SiC) substrate with an AlN nucleation layer viewed parallel to the <1100> axis and normal to the <0001> and <1120> axes. A GaN layer is then grown epitaxially using 3D growth conditions along the <0001> axis; here using Molecular Beam Epitaxy (MBE) at a predetermined growth temperature and at a predetermined gallium to nitrogen flux ratio that results in a steady increase in surface roughness. Due to the lattice mismatch between the GaN and the underlying substrate, crystallographic dislocations (D) and significant bending of threading dislocations (B) are formed as shown in FIG. 1A. It is noted that after an initial annihilation region, these dislocations (D) continue to project along the <0001> axis. The majority of the bending dislocation interactions resulting in annihilation (A) and/or combination (C) of the dislocations and are shown to be confined within or near the 3D growth layer (an initial annihilation region). As noted by Manfra et al., with regard to the 3D to 2D (3D/2D) interface; shown in FIG. 1A, Manfra et al., states "The rough/smooth transition appears to minimize dislocation bending".

FIG. 1B is a cross-sectional scanning transmission electron microscopy (STEM) image along the <1100> zone axis of a GaN <0001> layer structure deposited using a two-step (3D to 2D) growth method whereby the GaN near the substrate is grown at a growth temperature and gallium to nitrogen flux ratio that results in 3D growth and the remainder of the GaN layer is grown at a growth temperature and gallium to nitrogen flux ratio that results in 2D growth.

SUMMARY

In accordance with the present disclosure, a structure is provided, comprising: a nucleation layer; and a Group III-Nitride structure disposed on a surface of the nucleation layer, the Group III-Nitride structure comprising a plurality of pairs of stacked Group III-Nitride layers, each one of the pairs of layers having a lower layer having a 3D growth structure and each one of the upper one of the pairs of layers having a 2D growth structure.

In one embodiment, each one of the lower layers has a surface roughness at completion greater than a surface roughness at completion of an upper one of the pair of layers.

In one embodiment, interface between each one of the upper layers and each one of the lower layers of the plurality of pairs of stacked Group III-Nitride layers has crystallographic dislocation combinations and/or annihilations therein.

The inventors have recognized that the number, or density, of crystallographic dislocations is reduced at the interface between the 3D grown layer and the 2D grown layer, even though Manfra et al. has noted "The rough/smooth transition appears to minimize dislocation bending". However, the inventors have further recognized that by repeating the 3D/2D growth process the crystallographic dislocations are successively reduced resulting from the corresponding successive combinations/annihilations. That is, the number, or density of, crystallographic dislocations remaining in the 2D grown layer after the first 2D grown layer can be further reduced by again forming a second interface between: a second 3D grown layer; and a second 2D grown layer. Thus, the inventors grow a second 3D grown layer, having a roughen surface on a previously 2D formed layer having a smooth surface, to enable the 3D to 2D process to be repeated so that a second 2D grown layer can be produced with fewer crystallographic dislocations than in the first 2D grown layer. In this way, the number, or density of, dislocations can be successively reduced as the process continues.

In one embodiment, a plurality of pairs of vertically stacked Group III-Nitride layers is provided. An upper one of the stacked Group III-Nitride layers of each one of the plurality of pairs of stacked Group III-Nitride layers has crystallographic dislocation combinations and annihilations therein. The number or density of crystallographic dislocation combinations and annihilations decreases in the upper one of the stacked Group III-Nitride layers along a direction vertically from the surface of the nucleation layer.

In one embodiment, a method is provided for forming a Group III-Nitride structure comprising: (a) growing a first Group III-Nitride layer epitaxially on a nucleation layer with crystallographic dislocations being produced in the nucleation layer and propagating from the nucleation layer into the first Group III-Nitride layer during the growing of the first Group III-Nitride layer with a first density of the crystallographic dislocations; (b) growing a second Group III-Nitride layer epitaxially on the grown first Group III-Nitride layer with a portion of the crystallographic dislocations produced during the growing of the first Group III-Nitride combined and/or annihilated decreasing the density of the crystallographic dislocations propagating through the second Group III-Nitride layer during the growth of the second Group III-Nitride layer; and (c) growing a third Group III-Nitride layer epitaxially on the grown second Group III-Nitride layer with a portion of the crystallographic dislocations propagating from the second Group III-Nitride layer into the third Group III-Nitride layer during the growth of the third Group III-Nitride layer.

In one embodiment, the first Group III-Nitride layer and the third Group III-Nitride layer are grown using 3D growth and the second Group III-Nitride layer is grown using 2D growth.

In one embodiment, a structure is provided, comprising: a nucleation layer; a Group III-Nitride structure disposed on a surface of the nucleation layer, such Group III-Nitride structure comprises a stack of a plurality of pairs of Group III-Nitride layers having successively lower densities of crystallographic dislocations disposed at interfaces between the Group III-Nitride layers of each one of the pairs of layers.

In one embodiment, a structure is provided comprising: a first Group III-Nitride layer; a second Group III-Nitride layer on a surface of the first Group III-Nitride layer, the second Group III-Nitride layer on the surface of the first Group III-Nitride layer having a surface smoother than the surface of the first Group III-Nitride layer; a third Group III-Nitride layer on the surface of the second Group III-Nitride layer having a surface rougher than the surface of the second Group III-Nitride layer The inventors recognized that it is not just the creation of a rough surface morphology that creates movement of the dislocations in Group III-Nitrides, rather it is the process of roughening the material around dislocations, such that the dislocations reside in topological valleys, and then switching to growth conditions to fill in the topological valleys that forces the dislocations to propagate with a component normal to the growth direction, thereby increasing the probability the dislocations can interact and either combine or annihilate during growth. The inventors recognized that forcing the dislocations to have an in-plane directional component to increase their likelihood of clustering does not need to be limited to the first 100 nm of GaN and that clustering can continue to occur through the growth process by continuing to alter the growth conditions between rough surfaces and smooth surfaces. In this method, dislocations are forced to have an in-plane directional component a plurality of times during the growth thereby increasing the number of opportunities for the dislocations to cluster and either annihilate or combine. The inventors also recognize that the surface roughness, or depth of the valleys, does not need to be extensive to create such movement. The GaN surface can begin to roughen within the first 10 nm upon switching growth conditions and create a sufficiently rough surface morphology to move dislocations after 30 nm to 100 nm of growth. This surface roughness can typically be repaired over comparable thicknesses, for example within 50 nm to 200 nm of growth, enabling multiple transitions between rough and smooth growth surfaces to occur within a 1-2 micron thick GaN structure.

The transitions from rough to smooth create periods of growth where dislocation movement and clustering is significantly higher than other periods of growth. Consequently, the inventors also recognize that a GaN structure can be created with layers of relatively high dislocation reduction and layers of relatively low dislocation reduction and that the placement of these layers in the structure can be controlled by adjusting the growth conditions of the GaN. Such a structure is identifiable through the use of cross-sectional transmission electron microscopy (TEM) imaging technology.

More particularly, the inventors have recognized that the clustering and reduction of dislocations during the growth of Group III-Nitrides by switching from a three-dimensional (3D) growth regime (where the surface atoms typically do not have sufficient mobility to find a step edge and the growth surface begins to get rougher over time) to a two-dimensional (2D) growth regime (where the growth surface is relatively smooth on the atomic scale and subsequent growth does not significantly increase the roughness of the layer being grown; this is usually the result of sufficient time and mobility for surface atoms to find a step edge before permanently bonding to the growth surface) does not need to be isolated to a single switching event as in the two-step growth method, but can be repeated multiple times throughout the Group III-Nitride growth. The inventors have also recognized that the greater the number of opportunities there are for the movement of dislocations during growth, the more effective the growth is in clustering and reducing dislocations. For GaN (0001) growth, a dislocation reduction buffer structure can be formed by continually alternating the growth conditions to move from an intermediate growth regime to a Ga-droplet growth regime and then moving back to an intermediate growth regime.

With such method, a dislocation reduction buffer structure is provided wherein dislocations are systematically bent at defined intervals to reduce their density in the Group III-Nitride material while simultaneously promoting flat surface morphologies. Radio frequency (RF) devices can be fabricated from AlGaN/GaN hetero-structures with the dislocation reduction GaN buffer structure on mismatched substrates like silicon, silicon carbide, and sapphire.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 8A shows a cross-sectional STEM image along the <1100> zone axis of a GaN(0001) layer structure with ten 3D to 2D growth cycles grown by PAMBE; and FIG. 8B is a is a qualitative dislocation density plot as a function of the growth thickness for the structure shown in FIG. 8A.

Like reference symbols in the various drawings indicate like elements.

DETAILED DESCRIPTION

Figure 1A:
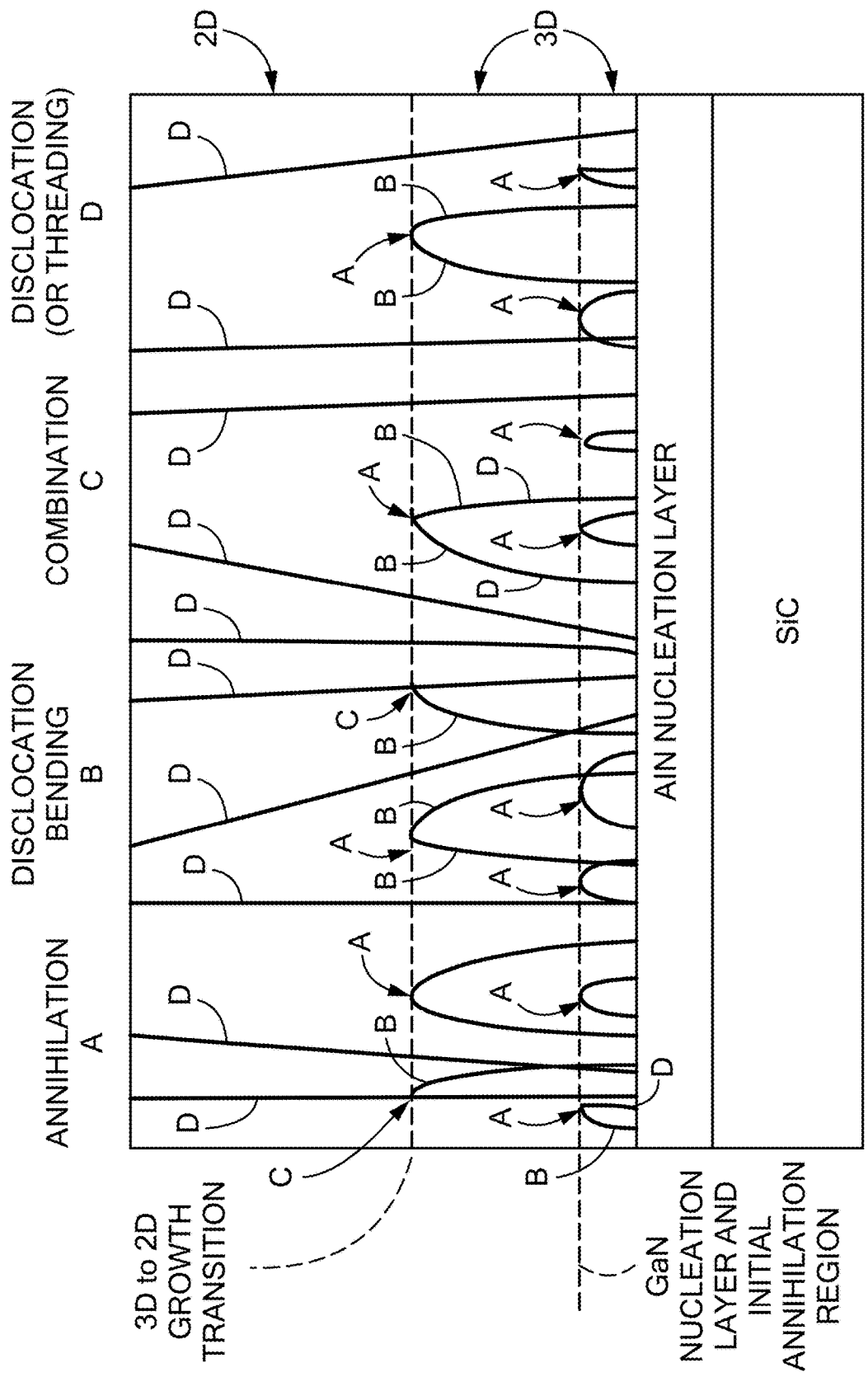
FIG. 1A is a diagrammatical, cross-sectional sketch of a Group III-Nitride structure according to the PRIOR ART.
Figure 1B:
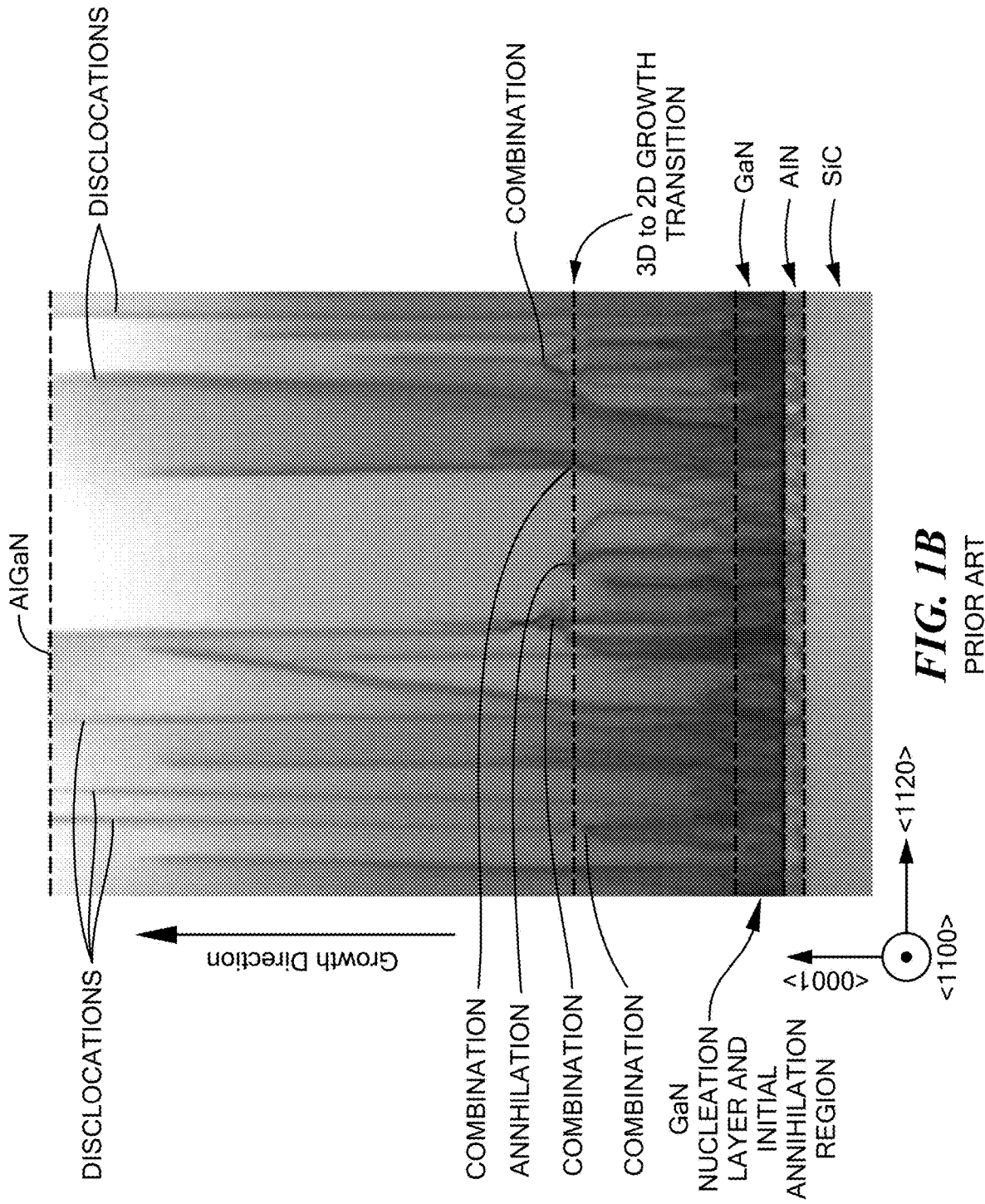
FIG. 1B is a cross-sectional scanning transmission electron microscopy (STEM) image along the <1100> zone axis of a GaN (0001) layer structure deposited using a two-step (3D to 2D) growth process according to the PRIOR ART.
Figure 2:
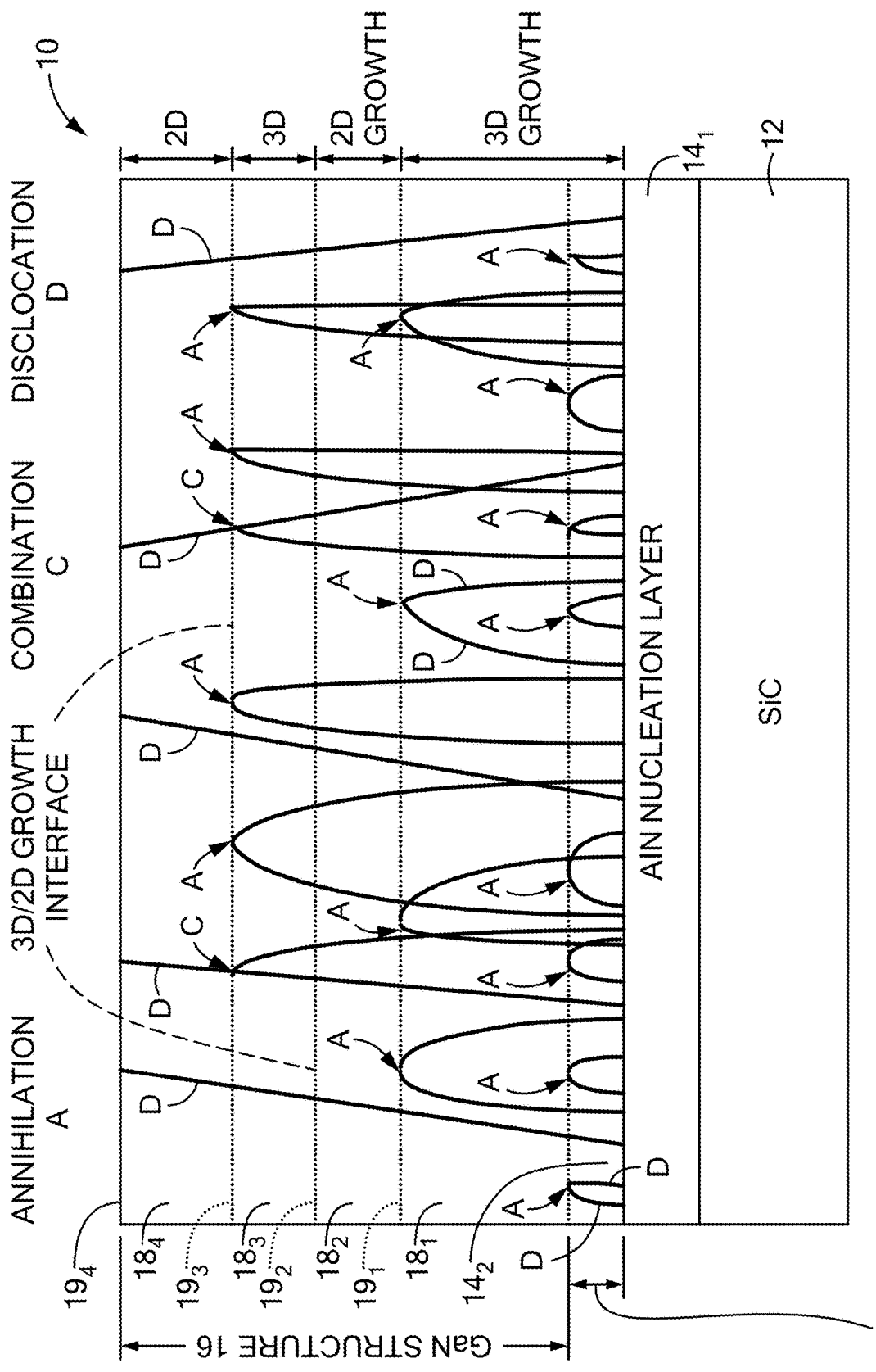
FIG. 2 is a diagrammatical, cross-sectional sketch of a Group III-Nitride structure according to the disclosure.

Referring now to FIG. 2, a structure 10 is shown having a substrate 12, a nucleation layer 14; and a Group III-Nitride, here Gallium Nitride (GaN), structure 16. The nucleation layer 14 is disposed between the substrate 12 and the Group III-Nitride structure 16 and it may be formed by one or more crystalline material layers. Here the nucleation layer 14 is shown to have an AlN nucleation layer $14_1$ and a GaN nucleation layer $14_2$, which serves as an initial annihilation region. The Group III-Nitride structure 16 is a 4 layer structure having layers $18_1$-$18_4$, where layers $18_2$ and $18_4$ are grown on layers $18_1$ and $18_3$, respectively, as shown. Layers $18_1$ and $18_3$ are grown using conditions that cause the surface of the layers to become rougher as they are grown. These growth conditions will be referred to as 3D growth. Layers $18_2$ and $18_4$ are grown using conditions that cause the surface of the layers to become smoother as they are grown and these growth conditions will be referred to as 2D growth. Thus, Group III-Nitride layer $18_2$ has a surface at completion that is smoother than the surface of the Group III-Nitride layer $18_1$ at completion; Group III-Nitride layer $18_3$ has a surface at completion that is rougher than the surface of the Group III-Nitride layer $18_2$ at completion; and so forth. Further, the crystallographic dislocation (D) density is reduced because of annihilation (A) and combination (C) when layers $18_2$ and $18_4$ are grown on layers $18_1$ and $18_3$, as indicated in FIG. 2.

Thus, the Group III-Nitride structure comprises a plurality of pairs of stacked Group III-Nitride layers (pair $18_1$, $18_2$ and pair $18_3$,$18_4$), each one of the pairs of layers having a lower layer (layer $18_1$ and $18_3$) having a 3D growth structure and each one of the pairs of layers having an upper layer (layer $18_2$ and $18_4$) having a 2D growth structure. Each one of the lower layers (layer $18_1$ and $18_3$) has a surface roughness at completion greater than a surface roughness of an upper layer (layer $18_2$ and $18_4$) in the pairs of layers. Further, the 3D to 2D growth interfaces $19_1$ and $19_3$ have crystallographic dislocation combinations (C) and/or annihilations (A) therein.

Figure 3:
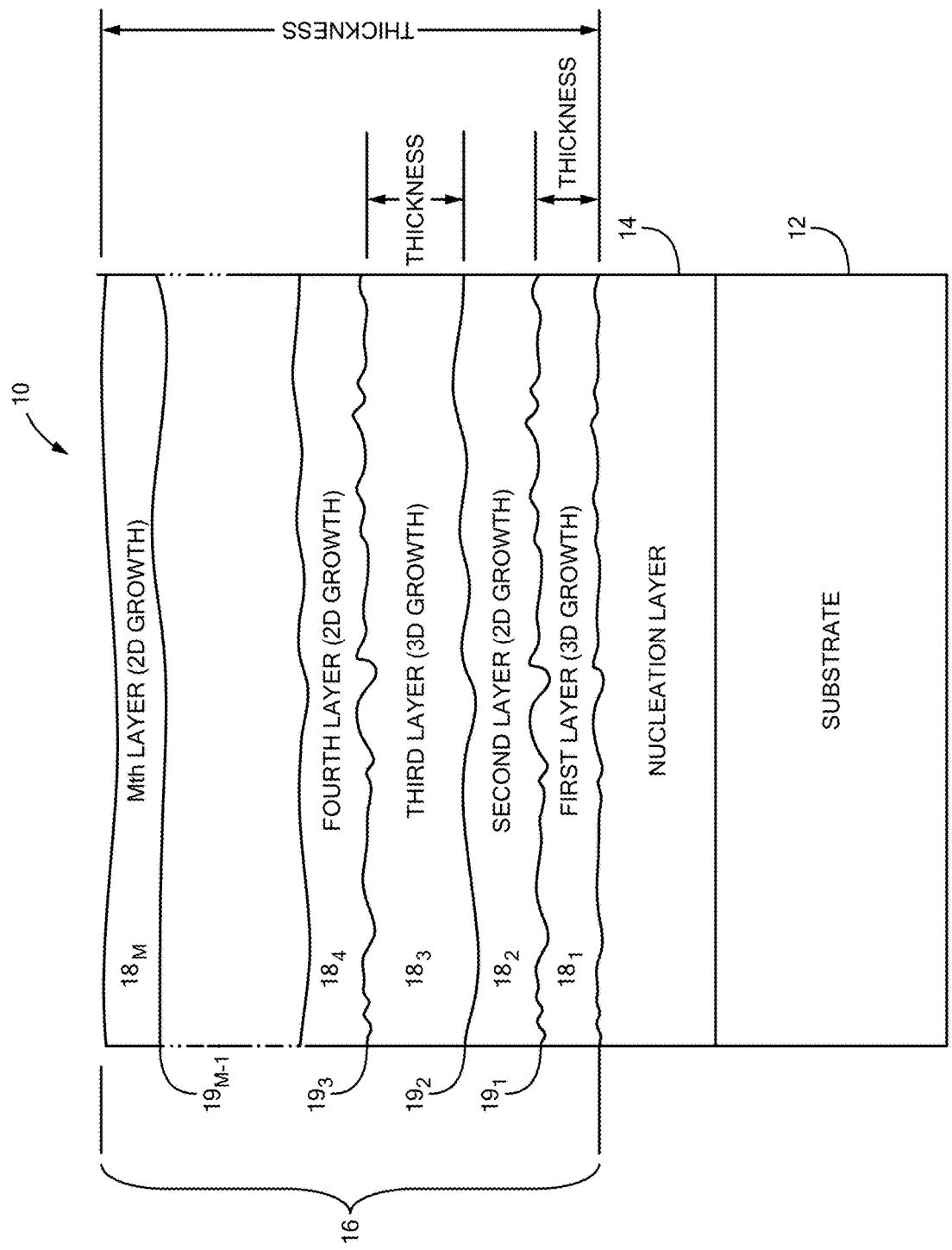
FIG. 3 is a diagrammatical cross-sectional view of a Group III-Nitride structure according to the disclosure.

Referring now to FIG. 3, here the Group III-Nitride structure is an M layer structure, where M is an integer greater than 3, having layers $18_1$-$18_M$, where layers $18_2$, $18_4$ . . . $18_M$ are grown on layers $18_1$, $18_3$ . . . $18_{M-1}$, respectively, as shown. Layers $18_1$, $18_3$ . . . $18_{M-1}$ are grown using conditions that cause the surface of the layers to become rougher as they are grown. These growth conditions will be referred to as 3D growth. Layers $18_2$, $18_4$ . . . $18_M$ are grown using conditions that cause the surface of the layers to become smoother as they are grown and these growth conditions will be referred to as 2D growth. Thus, Group III-Nitride layer $18_2$ has a surface at completion that is smoother than the surface of the Group III-Nitride layer $18_1$ at completion; Group III-Nitride layer $18_3$ has a surface at completion that is rougher than the surface of the Group III-Nitride layer $18_2$ at completion; and so forth. More particularly, the rate of dislocation reduction is highest near the transitions, $19_1$, $19_3$, $19_{M-1}$, in the Group III-Nitride structure 16 where the growth is switched from 3D growth to 2D growth. Thus, referring to FIG. 4 the final roughness of layer $18_1$ is $R_1$, the final roughness of layer $18_2$ is $R_2$ where $R_1 > R_2$, the final roughness of layer $18_3$ is $R_3$ where $R_1 \geq R_3 > R_2$ and so forth, until final layer $18_M$ has a roughness of $R_M$, where $R_M < R_{M-1}$. Thus, the Group III-Nitride structure 16 grows to a final surface smoother than the surface of the nucleation layer 14.

Figure 4:
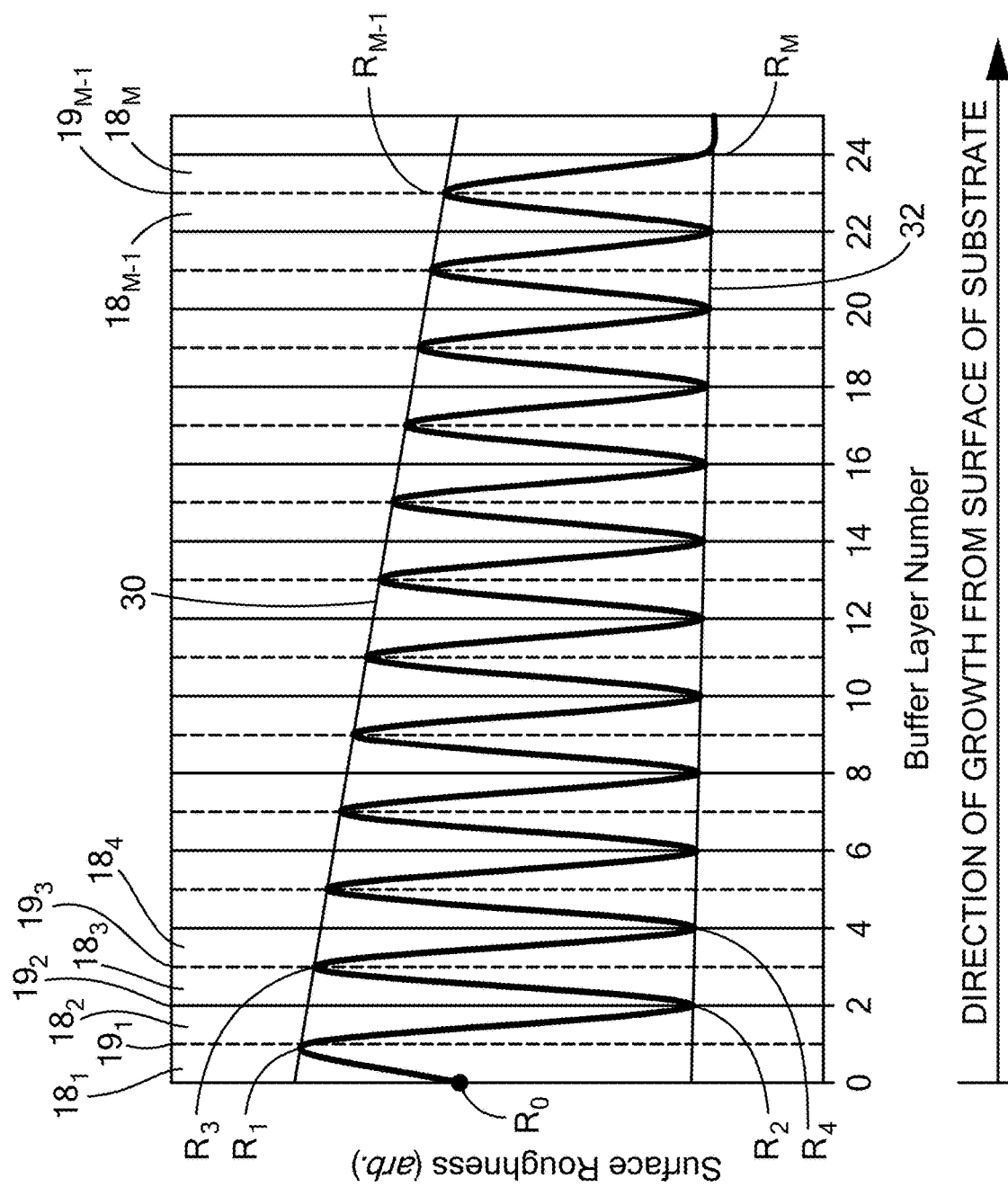
FIG. 4 is a graph showing surface roughness of each of a plurality of layers grown by successively by a 3D growth followed by a 2D growth according to the disclosure.

Referring now to FIG. 4, a curve 30, formed by plotting the maximum surface roughness for the 3D grown layers $R_1$, $R_3$, . . . $R_{M-1}$, versus the corresponding layer number, should generally remain constant or trend to lower levels of surface roughness as the layer number increases and the Group III-Nitride thickness increases. A curve 32, formed by plotting the minimum surface roughness for the 2D grown layers $R_2$, $R_4$, . . . $R_M$, versus the corresponding layer number, should generally remain constant or trend to lower levels of surface roughness as the layer number increases and the Group III-Nitride thickness increases. The surface roughness $R_0$ of the completed nucleation layer 14 should generally be less than $R_1$ and can be reduced, if necessary, by growing a Group III-Nitride layer by 2D growth as part of the nucleation layer before initiating the growth of structure 16. Significant annihilation and combination of dislocations occurs in the initial nanometers of the Group III-Nitride due in part to the coalescing of nuclei formed during the initial stages of deposition, the large number of dislocations that are generated by the epitaxial mismatch, and the relative proximity of the dislocations to one another. This period of initial growth, which can be on the order of 10 nm to 100 nm in thickness, is included as part of the nucleation layer 14 and the structure of Group III-Nitride structure 16 is designed to reduce the defects emanating out of the nucleation layer 14.

Figure 5:
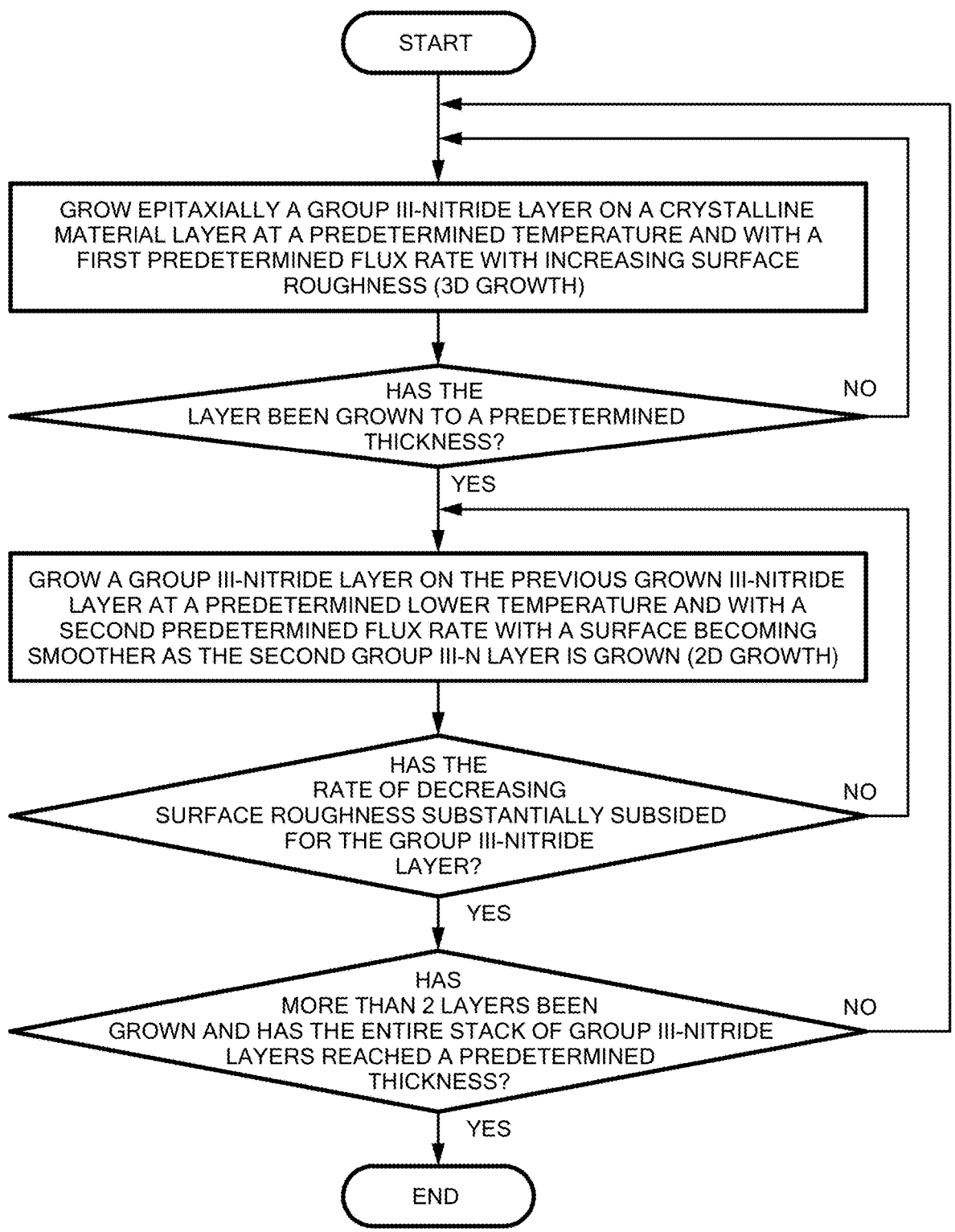
FIG. 5 is a process flow chart showing the steps used in fabricating a structure according to the disclosure.

Referring now to FIG. 5, a process flow diagram is shown of the process used to form the Group III-Nitride structure 16 (FIG. 3). The layer $18_1$ is grown by 3D growth using MBE at a predetermined growth temperature and at a predetermined group III to nitrogen flux ratio that results in a steady increase in surface roughness. Once the desired thickness of the layer $18_1$ is reached, the growth conditions are adjusted to a second predetermined growth temperature and a second predetermined group III to nitrogen flux ratio and the layer $18_2$ is grown using 2D growth such that there is a steady decrease in surface roughness. Growth of the layer $18_2$ continues until the rate of the decrease in surface roughness substantially subsides with continued growth. For a specified set of 2D growth conditions, there is a steady state surface roughness that will be approached following an extended period of growth, but the rate of approach slows with additional growth. Surface roughness can be monitored in-situ by reflection high-energy electron diffraction (RHEED), or measured outside of the growth system by scanning probe microscopy techniques such as atomic probe microscopy and scanning tunneling microscopy. In practice, the growth of the layer $18_2$ should progress until the resulting RHEED pattern for the Group III-Nitride becomes streaky indicating a flat surface morphology. RHEED diffraction patterns are sensitive to the top few atomic layers of the growth surface. Streaky RHEED patterns are indicative of flat, two-dimensional growth surfaces, while spotty patterns are usually indicative of rougher, three-dimensional growth surfaces. The Ga-droplet growth regime for GaN can produce atomically flat surfaces and streaky RHEED patterns. The improved morphology over more nitrogen rich growth conditions is attributed to a change in the adatom mobility. Under more nitrogen rich conditions, gallium adatoms have a lower surface mobility resulting in a kinetically limited growth process that produces rougher three-dimensional surface morphologies. Spotty RHEED patterns are associated with rougher surfaces.

Because RHEED monitoring of the Group III-Nitride under 2D growth conditions may require removing the liquid metal layer from the surface to observe the crystalline diffraction pattern from the layer $18_2$, in practice the layer $18_2$ is grown for a specific growth time that has been previously calibrated from in-situ RHEED measurements.

Following the growth of the layer $18_2$, the growth conditions are transitioned back to the 3D growth conditions of the layer $18_1$ and the process flow is repeated for layers $18_3$ and $18_4$. Once the sum of the layer thicknesses from the layers $18_1$ through $18_M$, where M is an even integer greater than 2, exceeds the desired thickness of the Group III-Nitride structure 16, the process flow ends.

When the Group III-Nitride in structure 16 is, for example GaN, the growth temperature during growth of layer $18_1$ is, in this example, approximately 720-770° C., and close to the decomposition temperature of the GaN. The lower the gallium flux, the faster the surface roughens and so it is desirable to set the gallium flux as low as possible while maintaining at least an adlayer of gallium coverage required to keep impurity incorporation of oxygen low. Secondary ion mass spectrometry (SIMS) depth profiling can be used to monitor background impurity incorporation concentrations. If the gallium flux is too low during growth in this regime, the incorporation of oxygen will increase relative to other parts of the GaN buffer growth. High gallium fluxes during GaN growth in this regime slow the roughening process and lead to a degradation in the material performance of HEMT structures fabricated on these buffers. Growth within this 3D growth regime typically spans somewhere, in this example, between 20 nm to 100 nm of growth. Too thin and the surface does not have adequate time to roughen, too thick and the benefits of roughening the surface begin to diminish while requiring more time to recover the smoothness of the surface in the layer to follow. Actual thickness also depends on the roughness at the start of the buffer, which is a function of many things including the substrate, the composition of the nucleation layer 14, and the lattice mismatch.

Following a span of 3D epitaxial growth of the layer $18_1$, the process enters a 2D epitaxial growth phase. This can most easily be achieved by lowering the growth temperature, raising the Ga flux, or a combination of the two whereby the growth temperature is cooled by approximately 10° C. to 90° C. over the span of 5 nm to 20 nm of growth and the gallium flux is adjusted upward to the flux needed for growth in the Ga-droplet regime. The growth does not need to be stopped or interrupted during the transitional step, which can help minimize the possibility of impurity incorporation. Once the growth temperature and gallium flux reach their new values, the 2D growth of layer $18_2$ proceeds in the Ga-droplet regime. In this regime the growth temperature for GaN is generally around 680-720° C. as measured by an optical pyrometer and the gallium flux is set to the minimum flux required to produce a liquid gallium layer on the surface during approximately the first 5 nm of growth within this regime. The formation of gallium on the surface of a wafer can be monitored in-situ using a white light source shining on the surface. When gallium begins to accumulate on the surface in appreciable quantities (greater than 2.5 monolayers) it causes the light to scatter, which can be detected through a visual inspection of the wafer surface. In PAMBE, the gallium flux generated from a Knudsen cell can slowly drift with time as the amount of gallium in the cell crucible decreases with time. Although beam equivalent pressure measurements can be used to calibrate the flux before the onset of growth, the visual observation of the gallium coverage time provides real time feedback for the relative gallium flux rate. For higher growth temperatures or higher nitrogen plasma rates the gallium flux required for surface accumulation also increases. Growth within the Ga-droplet regime typically spans somewhere between 50 nm of growth to 200 nm of growth. The high surface mobility of adatoms in this regime enables 2D epitaxial growth.

As the surface transitions from 3D growth to 2D growth, dislocations begin to bend away from the growth direction and develop a lateral component to their propagation, thereby increasing the probability for interactions between the dislocations and increasing the probability for dislocation or threading combinations and/or annihilations. As the surface flattens, the lateral component of the propagation of the dislocations is reduced and the dislocations begin to resume their propagation normal to the surface and along the growth direction.

Following 50 to 200 nm of 2D growth, the surface becomes smooth and RHEED patterns show a streaky pattern. In general, the growth thickness of the 2D layers is usually between 0.5 to 2 times the thicknesses of the 3D layers.

After growth of the layer $18_2$, the process returns to the 3D epitaxial growth conditions by raising growth temperature approximately 10° C. to 90° C., over the span of 5 nm to 20 nm of growth and lowering the gallium flux to the flux needed for growth in the higher temperature intermediate growth regime. The growth does not need to be stopped or interrupted during this transitional step.

Following the growth of the layer $18_3$ under the 3D epitaxial growth conditions, the process returns to 2D growth conditions and the layer $18_4$ is grown on the layer $18_3$. A 3D to 2D growth cycle is defined to contain a period of growth in the 3D intermediate growth regime, a transition to and growth within the 2D Ga-droplet regime, and a transition back to the 3D intermediate growth regime.

The process continues until the structure reaches a predetermined thickness; for example in the range of 1 to 2 microns. It is noted that when the thicknesses of the layers for each subsequent 3D to 2D growth cycle are kept constant, the maximum roughness of the 3D grown layers should successively improve as illustrated by curve 30 in FIG. 3.

Growth under 3D growth conditions roughens the surface and the subsequent transition to 2D growth conditions causes the surface to become smoother. The transition between 3D and 2D growth provides favorable conditions for GaN dislocations to combine and/or annihilate, leading to a significantly higher dislocation reduction rate during these transition periods. Subsequently it is possible to exert some control over the dislocation density profiles in a Group III-Nitride buffer and to fabricate structures with distinct dislocation density profiles.

Figures 6A, 6B:
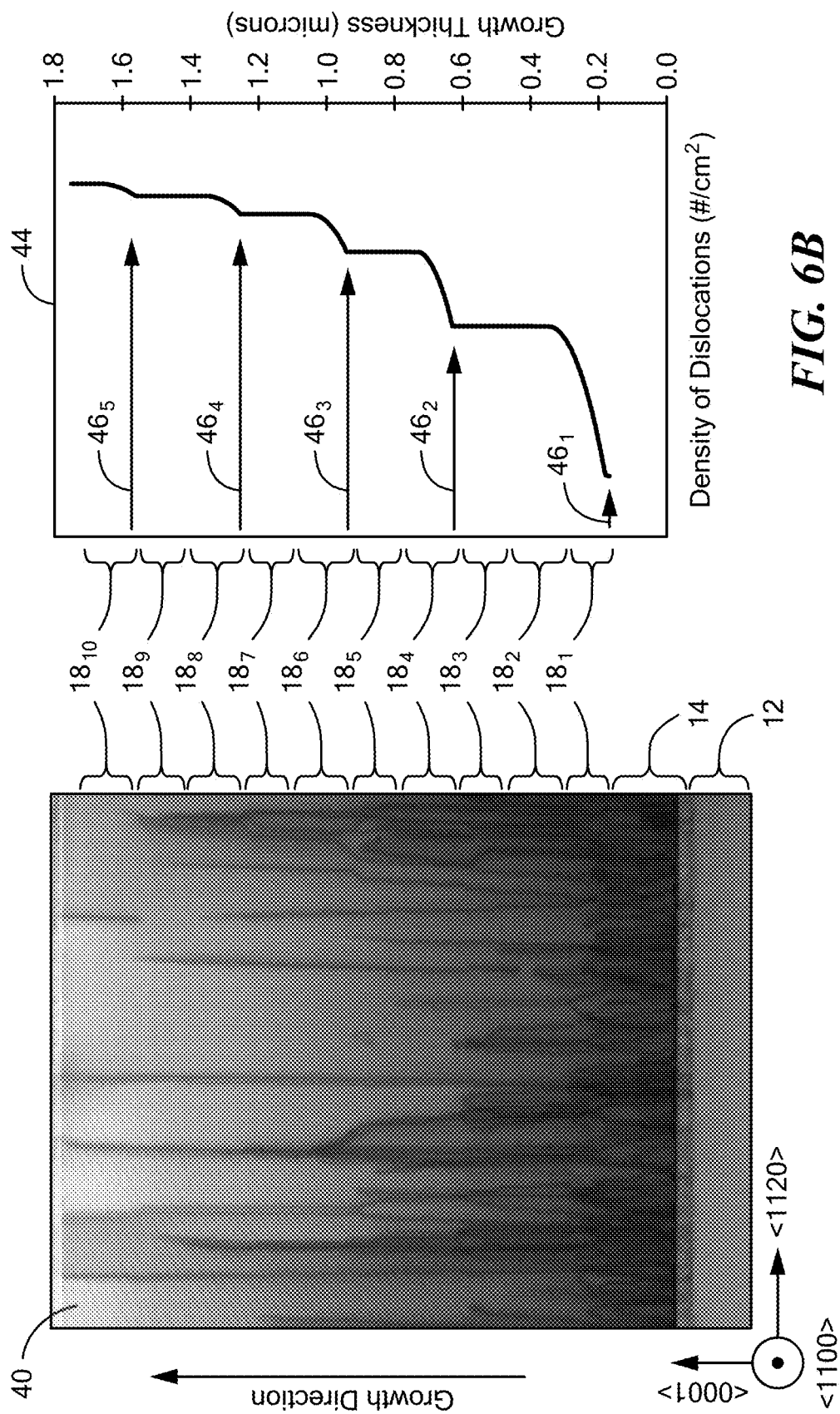
FIG. 6A shows a cross-sectional STEM image along the <1100> zone axis of a GaN(0001) layer structure with five 3D to 2D growth cycles grown by PAMBE and FIG. 6B is a is a qualitative dislocation density plot as a function of the growth thickness for the structure shown in FIG. 6A.

FIG. 6A shows a cross-sectional STEM image 40 along the <1100> zone axis of a GaN(0001) layer structure with five 3D to 2D growth cycles grown by PAMBE. The growth was performed on a SiC(0001) substrate 12 and a nucleation layer 14 comprised of an AlN layer and a 150 nm GaN layer. Each cycle in the growth encompassed 320 nm of growth with 100 nm in a higher temperature intermediate growth regime, 160 nm in a Ga-droplet regime, two transitional steps between the growth regimes of 20 nm each, and a short Ga modulation step of 20 nm. The modulation step occurred in the middle of the Ga-droplet regime growth and moves the growth conditions to the higher temperature intermediate growth regime to desorb excess gallium from the surface before resuming growth in the Ga-droplet regime.

The 3D growth layers, $18_1$, $18_3$, $18_5$, $18_7$, and $18_9$ and the 2D growth layers $18_2$, $18_4$, $18_6$, $18_8$ and $18_{10}$ are labeled on the right of the STEM image 40. Adjacent to the STEM image 40 in FIG. 6B is a qualitative dislocation density plot 44 as a function of the growth thickness for the GaN. Plot 44 shows the number of dislocations decreases over the course of the growth, but the rate of decrease is highest around transitions between the 3D and 2D growth layers $46_1$, $46_2$, $46_3$, $46_4$, and $46_5$. At each of the transitions $46_1$ thru $46_5$, the dislocations are observed in STEM image 40 to bend and in many cases meet with another dislocation whereby the dislocations either combine into one dislocation or annihilate one another. As a result, the number of remaining dislocations drops significantly during these transitions. As the number of dislocations is reduced, there are few dislocations to interact with and those that remain are spread farther apart leading to a reduction in the rate by which the dislocation density decreases with each new growth cycle. It is noted that some dislocations randomly disappear in the image 40 because the STEM specimens are not cut atomically straight with uniform atomic thickness; therefore, some of the threading dislocations seen in STEM image 40 appear to terminate before they reach the surface, but in actuality, the dislocations are simply exiting the side of the prepared STEM sample specimen.

The STEM image 40 also shows that during the majority of growth under the 2D and 3D growth conditions, the dislocations progress nearly parallel to the growth direction with the number of dislocations remaining nearly constant. The dislocations are found to combine and/or annihilate at the conclusion of the extended growth under the higher temperature intermediate growth regime conditions. In the middle of growth layers in the 2D Ga-droplet regime, a short modulated growth at the higher temperature intermediate 3D growth regime is performed to strip excess gallium from the surface before quickly transitioning back to the 2D growth conditions. The quick 20 nm transition to/from a 3D growth mode does not induce any dislocation combine and/or annihilate as the as the surface was not provided enough growth time to roughen under the 3D growth conditions. As such, transitions from the 3D growth conditions to the 2D growth conditions are not sufficient by themselves to induce dislocation movement if the surface is not provided an opportunity to roughen first.

Figures 7A, 7B:
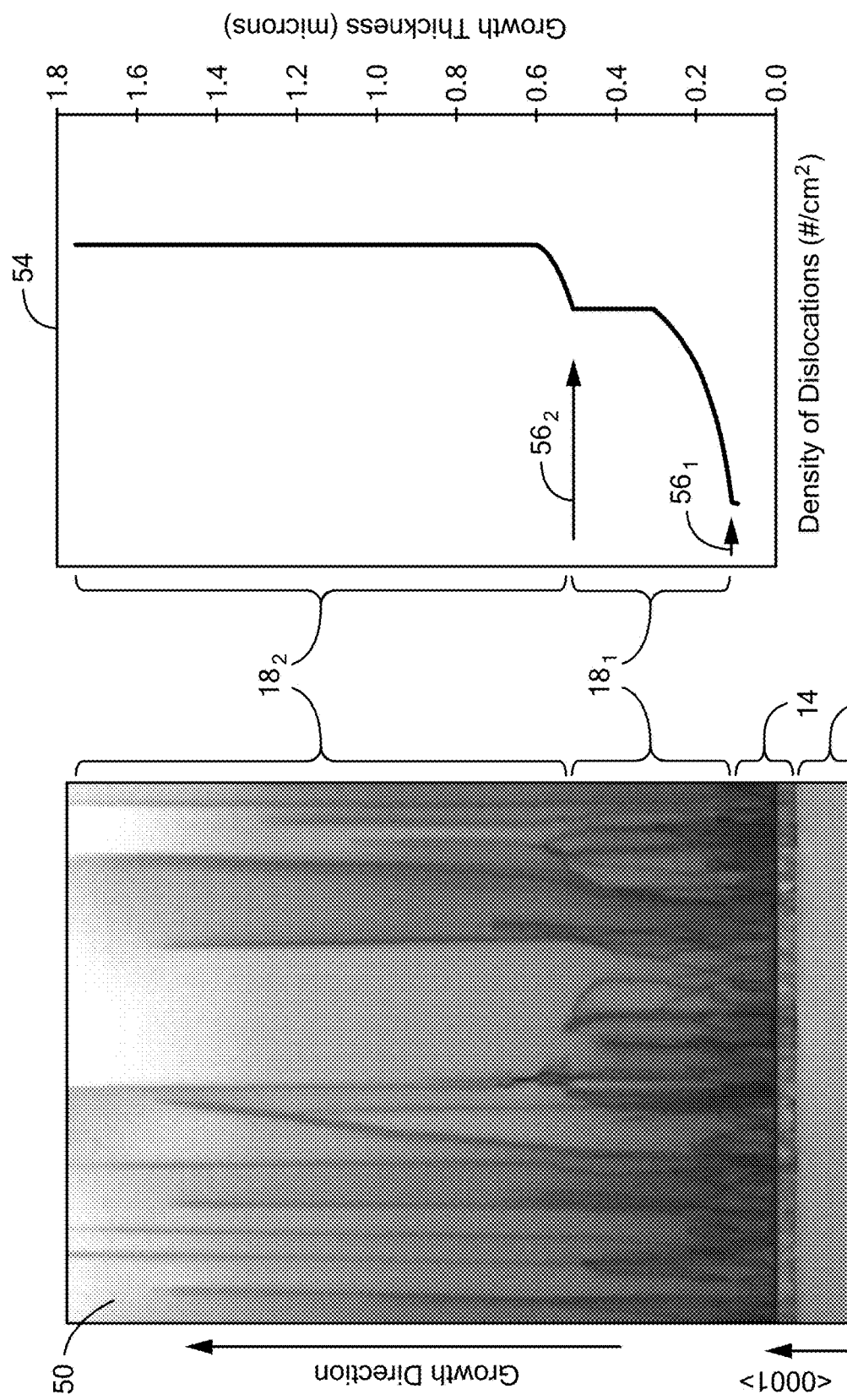
FIG. 7A shows a cross-sectional STEM image along the <1100> zone axis of a GaN(0001) layer structure with one 3D to 2D growth cycle grown by PAMBE according to the PRIOR ART.
FIG. 7B is a is a qualitative dislocation density plot as a function of the growth thickness for the structure shown in FIG. 7A.

FIG. 7A shows a cross-sectional STEM image 50 along the <1100> zone axis of a GaN(0001) layer structure with only one 3D to 2D growth cycle grown by PAMBE. The growth was performed on a SiC(0001) substrate 12 and a nucleation layer 14 comprised of an AlN layer and a 100 nm GaN layer. The GaN layer structure has an extended higher temperature 3D growth encompassing 500 nm of growth followed by 1.2 microns of 2D growth. The growth in the Ga-droplet regime included growth modulations to the higher temperature intermediate growth regime to clear excess surface gallium and keep the accumulation of gallium from becoming significant enough to degrade the GaN. FIG. 7B is a qualitative dislocation density plot 54 as a function of the growth thickness of GaN. Plot 54 shows the number of dislocations decrease over the course of the growth. There is significant reduction at the onset of growth due to the large number of misfit dislocations and the 3D roughening of the surface. However, the reduction rate eventually falls to nearly zero and additional growth under 3D growth conditions does not lead to further defect reduction. When the growth is transitioned to 2D growth there is another period where dislocations combine and/or annihilate as identified by arrow $56_2$. Following the transition to 2D growth the rate of defect reduction once again drops to nearly zero over the remaining micron of growth.

FIG. 8A shows a cross-sectional STEM image 60 along the <1100> zone axis of a GaN(0001) layer structure with 10 3D to 2D growth cycles grown by PAMBE. The growth was performed on a SiC (0001) substrate 12 and a nucleation layer 14 comprised of an AlN layer and a 100 nm GaN layer. Each cycle in the growth encompassed 160 nm of growth with 50 nm in the higher temperature intermediate growth regime, 80 nm in a Ga-droplet regime, and two transitional regimes of 20 nm each. FIG. 8B is a qualitative dislocation density plot 64 as a function of the growth thickness of the GaN. Plot 64 shows the number of dislocations decrease steadily over the course of the growth with regions of high defect reduction corresponding with a transition in growth between the 3D and 2D growth layers $66_1$ thru $66_{10}$. At each of the transitions $66_1$ thru $66_{10}$, the dislocations are observed in STEM image 60 to bend and in many cases meet with another dislocation whereby the dislocations either combine into one dislocation or annihilate one another. As a result, the number of remaining dislocations drops during these transitions. STEM image 60 also shows defect propagation occurs predominately parallel to the growth direction during the rest of the growth.

The STEM images 40, 50, and 60 show that the movement and reduction of dislocations in GaN MBE growth can be adjusted through transitions between 3D and 2D growth layers. GaN(0001) structures, containing alternating layers with high and low rates of dislocation reduction in predetermined locations, can be fabricated. The surface morphology of the GaN can also be controlled by varying the thickness of the 3D high temperature intermediate growth and the thickness of the 2D Ga-droplet growth. In the case of the structure grown in FIG. 8A, the thickness of the two layers was established such that the roughness of the surface became smoother after each successive growth cycle. The more dislocations can be forced to bend and propagate laterally during growth, the greater their opportunity for annihilation and/or dislocation reducing interactions. The total cycle thickness is ideally greater than 50 nm and less than 500 nm with two or more cycles being desired. Successive cycles do not need to be exactly the same thickness as a preceding cycle and the cycles can be spaced with non-cycled growth or with hetero-epitaxial layers. Doping can be adjusted within any given cycle and can be adjusted between different cycles and the composition of the Group III-Nitride layer can be adjusted within any given cycle and can be adjusted between different cycles.

Figure 9:
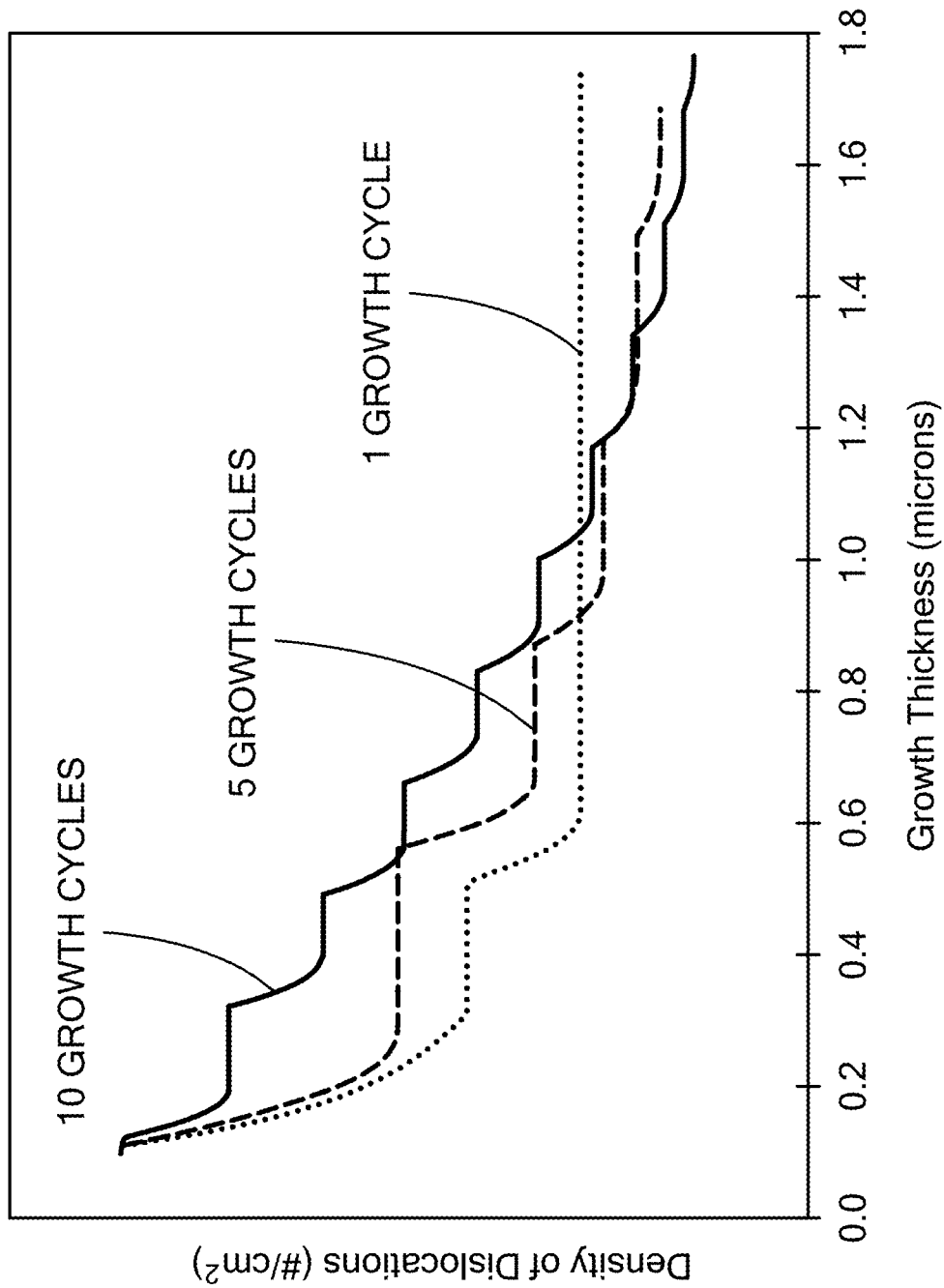
FIG. 9 shows a comparison between dislocation density (number of dislocations (#) per $cm^2$ of structure surface area for: the PRIOR ART (FIGS. 7A-7C) having (one (1) 3D to 2D growth cycle); a structure (FIGS. 6A-6C) having five (5) 3D to 2D growth cycles; and a structure (FIGS. 8A-8C) having ten (10) 3D to 2D growth cycles as a function of growth thickness.

FIG. 9 shows a comparison between the dislocation densities (number of dislocations (#) per $cm^2$ in Group III-Nitride Structures as a function of growth thickness for: the PRIOR ART (FIGS. 7A-7C) having (one (1) 3D to 2D growth cycle); a structure (FIGS. 6A-6C) having five (5) 3D to 2D growth cycles; and a structure (FIGS. 8A-8C) having ten (10) 3D to 2D growth cycles.

It should be understood that the growth conditions that typically matter the most are substrate temperature and the atomic/molecular fluxes of the source materials. However, the conditions are very material dependent as the bonding type and bond strength of the material being grown influence the surface mobility of incoming atoms and molecules. Additionally, the adsorption and desorption rate of the incoming sources are also material dependent; therefore, 2D growth conditions for GaN (substrate temperature and Ga/N flux ratio) are not the same as 2D growth conditions for AlN (substrate temperature and Al/N flux ratio).

A number of embodiments of the disclosure have been described. Nevertheless, it will be understood that various modifications may be made without departing from the spirit and scope of the disclosure. For example, the structures in this disclosure are not dependent on the fabrication technique and one or more parts may be grown by a wide variety of growth techniques including molecular beam epitaxy, chemical beam epitaxy, chemical vapor deposition, metal organic chemical vapor deposition, e-beam evaporation and combinations of techniques. The structures in this disclosure are independent of the various varieties of source materials and deposition methods that can be used with different growth techniques to fabricate the layers in the disclosed structures.

Further, it should be understood that other single crystal substrates 12 may be used such as free standing Group III-Nitride substrates or any crystalline substrate that enables the deposition of one or more crystalline Group III-Nitride overlayers with a single well defined crystalline orientation with respect to the substrate 12 crystal structure. This includes heterojunction structures formed via the deposition of one or more crystalline materials on another crystalline material, or formed by bonding one or more layers together to define a surface region that is crystalline and supports the crystalline growth of one or more Group III-Nitride materials. The addition of surfactants and dopants may also be used to alter the morphology and enable 2D and 3D growth under various growth conditions. Accordingly, other embodiments are within the scope of the following claims.

What is claimed is:

1. A structure, comprising: a nucleation layer; and a Group III-Nitride structure disposed on a surface of the nucleation layer, the Group III-Nitride structure comprising a plurality of pairs of vertically stacked Group III-Nitride layers; each one of the pairs of vertically stacked Group III-Nitride layers having a lower layer and an upper layer in direct contact with the lower layer; and wherein, for each one of the pairs of vertically stacked Group III-Nitride layers the density of crystallographic dislocation combinations and/or annihilations is higher at a transition between the lower layer and the upper layer of the stacked Group III-Nitride layers a direction vertically from the surface of the nucleation layer from the surface of the nucleation layer than at a transition between the upper layer and the lower layer in a lower one of the pairs of vertically stacked Group III-Nitride layers along a direction vertically from the surface of the nucleation layer.

2. A structure, comprising:
a first Group III-Nitride layer;
a second Group III-Nitride layer on a surface of the first Group III-Nitride layer, the second Group III-Nitride layer on the surface of the first Group III-Nitride layer, the second Group III-Nitride layer having a surface smoother that the surface of the first Group III-Nitride layer; and
a third Group III-Nitride layer on the surface of the second Group III-Nitride layer having a surface rougher than the surface of the second Group III-Nitride layer.

3. A structure, comprising: a nucleation layer; a Group III-Nitride structure disposed on a surface of the nucleation layer, such Group III-Nitride structure comprises a stack of a plurality of pairs of Group III-Nitride layers having successively lower densities of crystallographic dislocations disposed at interfaces between the Group III-Nitride layers of each one of the pairs of layers.

4. A method for forming a Group III-Nitride structure on a crystalline material layer, comprising:
(a) growing a first Group III-Nitride layer epitaxially on the crystalline material layer using 3D epitaxial growth;
(b) growing a second Group III-Nitride layer epitaxially on the grown first Group III-Nitride layer using 2D epitaxial growth;
(c) growing a third Group III-Nitride layer epitaxially on the second Group III-Nitride layer using 3D epitaxial growth;
(d) growing a fourth Group III-Nitride layer epitaxially on the third grown Group III-Nitride layer using 2D epitaxial growth.

5. A method for forming a Group III-Nitride structure on a crystalline material layer, comprising: (a) growing a first Group III-Nitride layer epitaxially on the crystalline material layer with increasing surface roughness; (b) growing a second Group III-Nitride layer epitaxially on the grown first Group III-Nitride layer with decreasing surface roughness until the surface roughness of the second Group III-Nitride layer is no longer decreasing at a first predetermined rate with additional growth; (c) growing a third Group III-Nitride layer epitaxially on the second Group III-Nitride layer with increasing surface roughness; (d) growing a fourth Group III-Nitride layer epitaxially on the third grown Group III-Nitride layer until the surface roughness of the second Group III-Nitride layer is no longer decreasing at a second predetermined rate with additional growth.

6. The method recited in claim 5 wherein the growing a first and third Group III-Nitride layers are 3D epitaxial grown layers and the second and fourth Group III-Nitride layer are 2D epitaxially grown layers.

7. A structure, comprising: a nucleation layer; and a Group III-Nitride structure disposed on a surface of the nucleation layer, the Group III-Nitride structure comprising a plurality of pairs of stacked Group III-Nitride layers, each one of the pairs of layers having a lower layer having a 3D growth structure and each one of the upper one of the pairs of layers having a 2D growth structure; and wherein each one of the lower layers has a thickness sufficient to produce dislocation combinations and/or annihilations and wherein each one of the upper layers is disposed on, and in direct contact with, a top surface of a corresponding one of the lower layers.

8. A structure, comprising: a nucleation layer; and a Group III-Nitride structure disposed on a surface of the nucleation layer, the Group III-Nitride structure comprising a plurality of pairs of vertically stacked Group III-Nitride layers; each one of the pairs of vertically stacked Group III-Nitride layers having a lower layer and an upper layer in direct contact with the lower layer; and wherein, for each one of the pairs of vertically stacked Group III-Nitride layers the density of crystallographic dislocation combinations and/or annihilations is higher at the transition between the lower layer and the upper layer of the stacked Group III-Nitride layers along a direction vertically from the surface of the nucleation layer than at the transition between the upper layer and the lower layer in a lower one of the pairs of vertically stacked Group III-Nitride layers along a direction vertically from the surface of the nucleation layer.

9. A structure, comprising: a nucleation layer; a Group III-Nitride structure disposed on a surface of the nucleation layer, such Group III-Nitride structure comprises a stack of a plurality of pairs of Group III-Nitride layers having successively lower densities of crystallographic dislocations disposed at interfaces between the Group III-Nitride layers of each one of the pairs of layers; and wherein each one of a lower one of the pair of layers has a thickness sufficient to produce dislocation combinations and/or annihilations at a top surface of such one of the lower layers and wherein each one of an upper layer of each one of the pair of layers is disposed on, and in direct contact with, such top surface of a corresponding one of the lower layer in such one of the pair of layers.

10. The structure recited in claim 7 wherein dislocations are systematically bent at the transitions between the lower layer and the upper layer in each one of the pairs of layers.

11. The structure recited in claim 7 wherein bent dislocations increase the number of crystallographic dislocation combinations and/or annihilations.

12. A structure, comprising: a nucleation layer; and a Group III-Nitride structure disposed on a surface of the nucleation layer, the Group III-Nitride structure comprising a plurality of vertically stacked pairs of Group III-Nitride layers, a lower one of Group III-Nitride layers in each one of the plurality of vertically stacked pairs having a higher density of crystallographic dislocations than a density of crystallographic dislocations in an upper one of Group III-Nitride layers in each one of the plurality of vertically stacked pairs layers; wherein the density of crystallographic dislocation combinations and/or annihilations is highest at the transition from the lower one to the upper one of Group III-Nitride layers in each one of the plurality of vertically stacked pairs of layers.

13. The structure recited in claim 12 wherein the regions having higher densities of crystallographic dislocation combinations and/or annihilations are spaced 80 nm to 300 nm apart.

14. A structure, comprising: a nucleation layer; and a Group III-Nitride structure disposed on a surface of the nucleation layer, the Group III-Nitride structure comprising a plurality of pairs of stacked Group III-Nitride layers, each one of the pairs of layers having a lower layer having a 3D growth structure, each one of the lower layers having a thickness in a range from 30 nm to 100 nm thick and each one of the upper one of the pairs of layers having a 2D growth structure, each one of the upper layers having a thickness in a range from 50 nm to 200 nm thick.

15. The structure recited in claim 14 wherein each one of the lower layers has a surface roughness at completion greater than a surface roughness at completion of an upper one of the pair of layers.

16. The structure recited in claim 15 wherein interfaces between each one of the upper layers and each one of the lower layers of the plurality of pairs of stacked Group III-Nitride layers have a greater number of crystallographic dislocation combinations and/or annihilations therein than within either one of the layers forming the pair.

17. A method for forming a Group III-Nitride structure on a crystalline material layer, comprising:
(a) growing a first Group III-Nitride layer epitaxially 30 nm to 100 nm thick on the crystalline material layer using 3D epitaxial growth;
(b) growing a second Group III-Nitride layer epitaxially 50 nm to 200 nm thick on the grown first Group III-Nitride layer using 2D epitaxial growth;
(c) growing a third Group III-Nitride layer epitaxially 30 nm to 100 nm thick on the second Group III-Nitride layer using 3D epitaxial growth;
(d) growing a fourth Group III-Nitride layer epitaxially 50 nm to 200 nm thick on the third grown Group III-Nitride layer using 2D epitaxial growth.

18. A structure, comprising: a nucleation layer; and a Group III-Nitride structure disposed on a surface of the nucleation layer, the Group III-Nitride structure comprising a plurality of pairs of stacked Group III-Nitride layers, each one of the pairs of layers having a lower layer having a 3D growth structure and each one of the upper one of the pairs of layers having a 2D growth structure wherein the density of crystallographic dislocations is reduced at the interface between the 3D grown layer and the 2D grown layer in each one of the pairs of layers, with each one of the successively higher pair of layers having reduced dislocations.

19. The structure recited in claim 7 wherein dislocations are systematically bent at the transitions between the lower layer and the upper layer in each one of the pairs of layers.

20. The structure recited in claim 19 wherein bent dislocations increase the number of crystallographic dislocation combinations and/or annihilations.

21. A method for forming a Group III-Nitride structure on a crystalline material layer, comprising:
(a) growing a first layer of Group III-Nitride material epitaxially on the crystalline material layer with increasing surface roughness, comprising:
depositing Group III-Nitride materials on the crystalline material layer;
(b) growing a second layer of Group III-Nitride material epitaxially on, and in direct contact with, the upper surface of the first layer, comprising:
(i) adjusting one or more of the Group III to nitrogen flux ratio and substrate temperature during deposition to form a liquid layer of Group III material on an upper surface of the first layer;
(ii) depositing Group III and nitrogen materials on the first layer of Group III-Nitride, such depositing maintaining the liquid layer of excess Group III material on an upper surface of the second layer, the second layer of Group III-Nitride material being grown with decreasing surface roughness as such second layer is grown progressively upward from the first layer;

(c) growing a third layer of Group III-Nitride material epitaxially on the upper surface second layer of Group III-Nitride material with increasing surface roughness as such third layer is grown progressively upward from the second layer.

22. The method recited in claim 21 wherein the first and second layers are grown at different temperatures.

23. A structure, comprising: a nucleation layer; and a Group III-Nitride structure disposed on a surface of the nucleation layer, the Group III-Nitride structure comprising a plurality of pairs of stacked Group III-Nitride layers, each one of the pairs of layers having a lower layer having a 3D growth structure and each one of the upper one of the pairs of layers having a 2D growth structure wherein the density of crystallographic dislocations is reduced at the interface between the 3D grown layer and the 2D grown layer in each one of the pairs of layers, with each one of the successively higher pair of layers having reduced dislocations.

24. A method for forming a Group III-Nitride structure on a crystalline material layer, comprising:

(a) growing a first Group III-Nitride layer epitaxially on the crystalline material layer using 3D epitaxial growth inducing roughness of an upper surface of the first Group III-Nitride layer;

(b) growing a second Group III-Nitride layer epitaxially on the grown first Group III-Nitride layer using 2D epitaxial growth, such growing reducing a rate of decrease in roughness of an upper surface of the second Group III-N layer being epitaxially grown;

(c) monitoring the rate of reduction in roughness of the upper surface of the second growth layer;

(d) when the monitored rate of reduction reaches a desired degree of roughness, growing a third Group III-Nitride layer epitaxially on the second Group III-Nitride layer using 3D epitaxial growth to a predetermined thickness;

(e) inducing roughness of an upper surface of the third Group III-Nitride layer; and (f) growing a fourth Group III-Nitride layer epitaxially on the third grown Group III-Nitride layer using 2D epitaxial growth;

(g) continuing (c) to (f) until the Group III-Nitride structure reaches a predetermined thickness.

* * * * *